United States Patent [19]

Menachem

[11] 4,404,660
[45] Sep. 13, 1983

[54] CIRCUIT AND METHOD FOR DYNAMICALLY ADJUSTING THE VOLTAGES OF DATA LINES IN AN ADDRESSABLE MEMORY CIRCUIT

[75] Inventor: Abraham Menachem, Herzlia, Israel

[73] Assignee: National Semiconductor Corporation, Santa Clara, Calif.

[21] Appl. No.: 152,950

[22] Filed: May 23, 1980

[51] Int. Cl.$^3$ .......................................... G11C 11/40
[52] U.S. Cl. .................................. 365/193; 365/210; 365/189
[58] Field of Search ............... 365/191, 193, 210, 189, 365/207

[56] References Cited

U.S. PATENT DOCUMENTS 3,798,616  3/1974  Spence .............................. 365/193

Primary Examiner—Terrell W. Fears
Attorney, Agent, or Firm—Paul J. Winters; Gail W. Woodward; Neil B. Schulte

[57] ABSTRACT

A two-phase memory circuit provides for adjusting the precharge voltage of a data line to substantially equal the threshold voltage of a sense amplifier coupled to the data line during a first phase so that a relatively small voltage change on the data line during a second phase can be detected by the sense amplifier.

16 Claims, 4 Drawing Figures

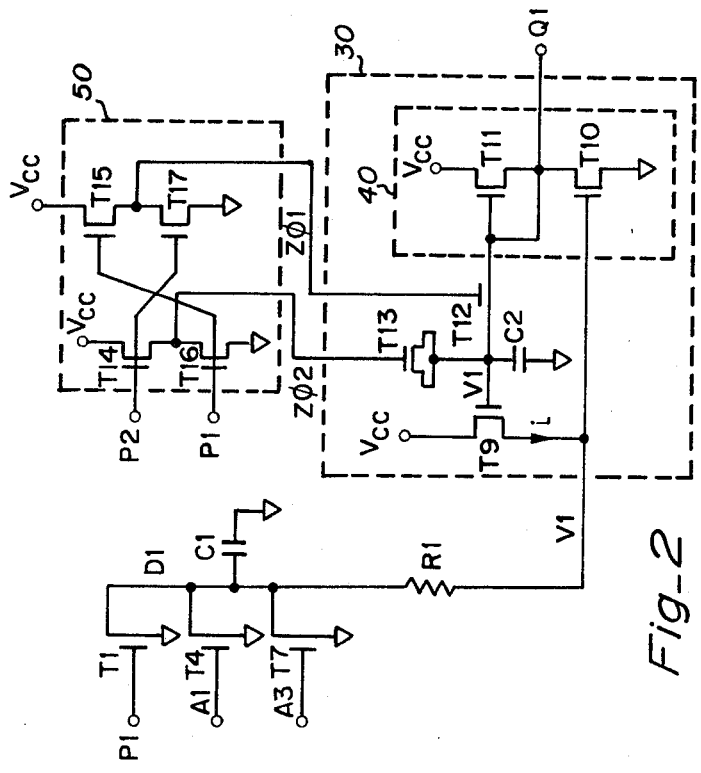
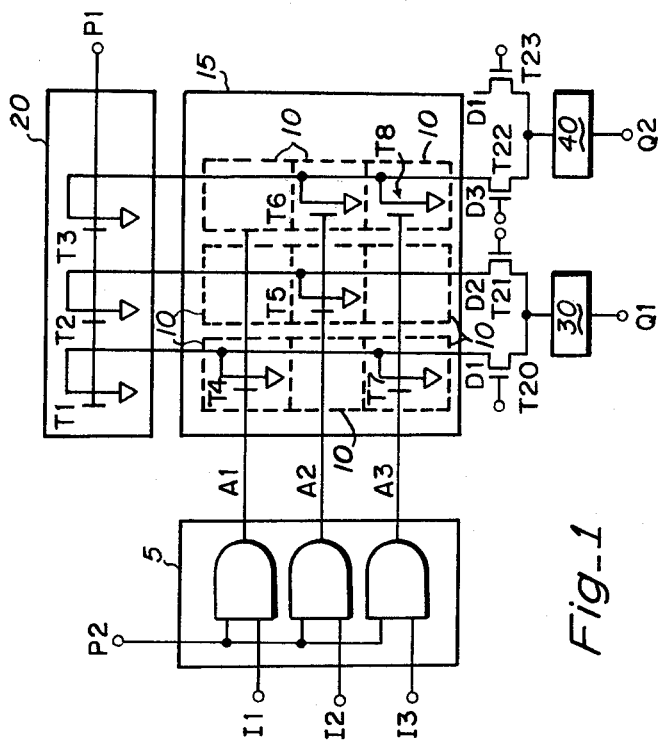
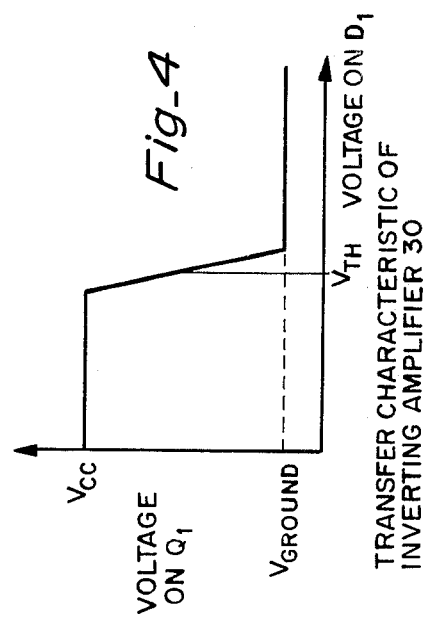
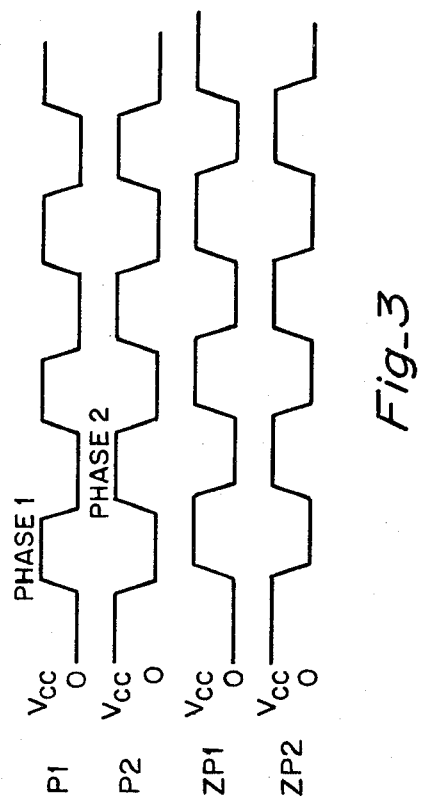
Fig._1
Fig._2
Fig._3
Fig._4

CIRCUIT AND METHOD FOR DYNAMICALLY ADJUSTING THE VOLTAGES OF DATA LINES IN AN ADDRESSABLE MEMORY CIRCUIT

BACKGROUND OF THE INVENTION (1) Field of Invention

The present invention relates generally to sensing output states of data lines of addressable memory circuits. More specifically, the preferred embodiment of the present invention is related to adjusting precharge voltages of data lines to substantially equal threshold voltages of sense amplifiers used to detect voltage changes on the data lines.

(2) Description of the Prior Art

Read Only Memories (ROMs) typically have data lines coupled to addressable memory cells and provide a data signal on a data line having a first or second amplitude corresponding to a logical "one" or "zero" associated with a selected data bit. A sense amplifier is coupled to each data line for sensing small changes in the amplitude of the data signal and for providing a logic level output signal on an output line in response to the value of the data signal. The sense amplifier is characterized by a threshold voltage having an amplitude between the first and second amplitudes and provides the logic level output signal representative of the amplitude of the data signal relative to the threshold voltage.

One of the limitations of conventional memory circuits is related to the large capacitance of the data lines. Especially in the case of large ROM arrays, the capacitance of the data lines is large relative to the size of the small array transistors of the addressable memory cells. This capacitance limits the speed at which the array transistors can charge or discharge the data lines, and thus limits the ultimate speed at which data can be read from the ROM.

Conventional memory circuits operate in two modes corresponding to alternating first and second clock phases. In a precharge mode, corresponding to the first clock phase, the data lines are charged to a supply voltage. In a sense mode, corresponding to a subsequent second clock phase, the data lines are selectively discharged to a ground voltage by the array transistors. Thus, the minimum time duration of the second phase is determined by the time needed for the data lines to be discharged from the supply voltage to less than the threshold voltage of the sense amplifier.

SUMMARY OF THE INVENTION

In accordance with the preferred embodiment of the present invention, a two-phase memory circuit having a feedback circuit responsive to the output of a sense amplifier provides for adjusting the precharge voltage of a data line to substantially equal the threshold voltage of the sense amplifier during a first clock phase. During a subsequent second clock phase, a selected memory cell coupled to the data line provides for increasing or decreasing the voltage on the data line in response to the value of the data bit stored in the selected memory cell. The input of the sense amplifier is coupled to the data line during this subsequent clock phase for providing a logic level output signal representative of the voltage on the data line relative to the threshold voltage.

BRIEF DESCRIPTION OF THE FIGURES

FIG. 1 is a block diagram of an addressable memory circuit having a word select circuit, a reference circuit, an addressable memory circuit having a number of memory cells and a number of sense amplifiers.

FIG. 2 is a detailed schematic diagram of a sense amplifier and the circuitry associated with a data line as in FIG. 1 in accordance with the preferred embodiment of the present invention.

FIG. 3 is a timing diagram of the clock signals used in the circuits of FIGS. 1 and 2.

FIG. 4 is a graph of the transfer characteristics of the inverting amplifier of FIG. 2.

DETAILED DESCRIPTION OF THE PREFERRED EMBODIMENT

Referring to FIG. 1, a word select circuit 5 is coupled to a number of memory cells 10 in an addressable memory circuit 15. The addressable memory circuit 15 has data lines D1, D2 and D3 coupled to a reference circuit 20 and coupled to sense amplifiers 30 and 40 respectively. In operation, a word select signal is applied to one of the inputs of the word select circuit 5 on input lines I1, I2 and I3. The word select circuit 5 is also coupled to receive a clock signal P2. In response to the receipt of clock signal P2 and to a word select signal, word select circuit 5 provides an address signal on one of the address lines A1, A2 and A3. For instance, if it is desired to read a data word associated with address line A1, a signal is applied to address line A1 during phase 2 (clock signal P2 at its high voltage level) in response to the occurrence of the clock signal P2 and to a signal being applied to input line I1.

Address lines A1, A2 and A3 are coupled to the addressable memory circuit 15. Addressable memory circuit 15 comprises a matrix of address lines and data lines. During a P1 clock signal, the data lines are coupled to ground through reference transistors in reference circuit 20. For example, data line D1 is coupled to ground through transistor T1 of reference circuit 20 during phase 1 (clock signal P1 at its high voltage level). During phase 2 the address lines are active and the data lines are selectively coupled to ground through the array transistors of addressable memory circuit 15. For instance, data line D1 is coupled to ground by transistor T4 during phase 2 in response to a signal on address line A1.

Memory cells 10 in addressable memory circuit 15 are defined as the circuitry associated with each intersection of an address line and a data line. The preferred embodiment of the present invention is implemented in a ROM wherein array transistors are selectively positioned in the different memory cells. For instance, the memory cell corresponding to the intersection of address line A1 and data line D2 is not characterized by an array transistor coupling data line D2 to ground in response to a signal on address line A1.

As can be appreciated by a person skilled in the art, a number of equivalent implementations of memory cells can be provided in accordance with the present invention. For instance, a programmable memory may provide for memory cells each having more than one transistor, wherein the data line is selectively coupled to the supply voltage or ground in response to a signal in the corresponding address line and the logical state of the memory cell.

Sense amplifier 30 is selectively coupled to either data line D1 or data line D2. Specifically, sense amplifier 30 is coupled to data line D1 in response to the application of a signal to the gate of transistor T20 and is coupled to data line D2 in response to the application of a signal to the gate of transistor T21. Similarly, sense amplifier 40 is selectively coupled to either data line D3 or D4 in response to the application of a signal to the gates of transistors T22 or T23 respectively. In the preferred embodiment, the gates of select transistors T20, T21, T22 and T23 are responsive to signals representing the least significant bits of the memory address. These select transistors have a conducting resistance which is selected to provide critical damping of the resonance associated with the capacitance of the data line. This damping eliminates oscillation of the data signal on the selected data line during the feedback controlled data line precharging described below. In the following description, it is assumed that the select transistor associated with any data line discussed is conducting.

As can be observed by a person skilled in the art, it would be equivalent to provide a discrete sense amplifier for each data line rather than sharing sense amplifiers among more than one data line.

Sense amplifiers 30 and 40 supply a current to each of the selected data lines. During the first phase a precharge voltage on the selected data lines is determined by the value of this current i and the resistance of the reference transistors in reference circuit 20. During the second phase the voltage on the selected data lines is determined by the current i, the presence or nonpresence of an active array transistor in addressable memory circuit 15 and the resistance of that active array transistor, if any. For instance, during phase 2, data line D1 will have a voltage determined by the current i and the resistance of array transistor T4 when address line A1 is active. In contrast, data line D2 will have a voltage determined by the value of the current i and the capacitance of data line D2 when address line A1 is active.

In the preferred embodiment of the present invention the resistance of the reference transistors in the reference circuit 20 is greater than the resistance of the array transistors of the memory cells 10. The data lines are also characterized by a parasitic capacitance which is large relative to the charging rates of the reference transistors and the array transistors. Thus, the data lines charge to a voltage higher than the precharge voltage during phase 2 if they are not coupled to ground by an active array transistor, and discharge to a voltage lower than the precharge voltage during phase 2 if they are coupled to ground by an active array transistor.

Sense amplifiers 30 and 40 are coupled to receive signals on the data lines and provide logic level output signals on the output data lines Q1 and Q2 during phase 2. A detailed schematic diagram of sense amplifier 30 and the circuitry associated with data line D1 is provided in FIG. 2. Referring to FIG. 2, the phase 1 clock signal P1 is applied to the gate of transistor T1 of reference circuit 20. Transistor T1 has a drain coupled to data line D1 and a source coupled to ground. Two array transistors T4 and T7 having gates coupled to address lines A1 and A3 respectively also have drains coupled to data line D1 and sources coupled to ground. In the preferred embodiment of the present invention the resistances of array transistors T4 and T7 are each less than the resistance of reference transistor T1 in the conduction mode. Preferably, the resistances of array transistors T4 and T7 are each approximately one-half the resistance of transistor T1.

Data line D1 is characterized by a resistance R1 and a capacitance C1. The resistance is the conducting resistance of select transistor T20. The capacitance is not a discrete element but is the intrinsic capacitance associated with a long data line in a read only memory. Data line D1 is selectively coupled to sense amplifier 20 by transistor T20.

Before explaining the details of the circuitry of sense amplifier 30, a more detailed explanation of the signals on data line D1 is provided. Specifically, the data line operates in two phases. During the first phase, associated with the P1 clock signal, sense amplifier 30 supplies a current i to data line D1. This current flows through data line D1 and transistor T1 and establishes a precharge voltage on data line D1. Preferably, this precharge voltage is substantially equal to the threshold voltage of the sense amplifier. During a subsequent second phase associated with the clock signal P2, a selected address line is active. The selected address line may have an array transistor which couples data line D1 to ground. For instance, if address line A1 is active, data line D1 will be coupled to ground by array transistor T4. Since the resistance of T4 is smaller than the resistance of T1, data line D1 will discharge and the voltage $V_1$ on data line D1 will drop to a voltage lower than the precharge voltage. However, if the content of the selected memory cell is a logical zero, corresponding to the memory cell not having a transistor coupled between the data line and gound, there is no discharge path provided and the voltage on the data line D1 will increase to a voltage greater than the precharge voltage. For instance, if address line A2 is active during the second phase, there is no transistor on data line D1 active and the voltage on data line D1 will charge to a voltage greater than the precharge voltage.

Sense amplifier 30 has a transistor T9 having a drain coupled to supply voltage VCC and a source coupled to data line D1. Transistor T9 operates as a current source for providing the current i to data line D1 in response to the value of the voltage V1 applied to its gate. Data line D1 is also coupled to the gate of transistor T10. Transistor 10 has its source coupled to ground and is coupled in series with transistor T11. Transistor T11 has a drain coupled to supply voltage VCC, a source coupled to the drain of transistor T10 and a gate coupled to its source which selectively provides a logic level output signal on the output line Q1 of sense amplifier 30. The transistor pair T11 and T10 provide a high gain inverting amplifier 40 having a preferred gain in the range of 10 to 20. As shown, transistor T10 is an enhancement device, while transistor T11 is a depletion device.

The output signal of the sense amplifier on output line Q1 is applied to the gate of transistor T9 during phase 1. This is accomplished by using transistor T12 as a switch. Specifically, transistor T12 has a drain coupled to output line Q1, a source coupled to the gate of transistor T9 and a gate coupled to receive clock signal ZP1. Sense amplifier 30 is coupled such that the gate of transistor T9 will sample the output signal on output line Q1 of the sense amplifier during phase 1 and store the value of the output signal on capacitance C2 during the second phase. In the present embodiment, capacitance C2 is not a discrete element but is an intrinsic capacitance associated with the gate of transistor T9.

In operation, when clock signal ZP1, applied to the gate of transistor T12, goes low, the gate of transistor T9 is discharged slightly as a result of the capacitive coupling between the gate and the source of transistor T12. To compensate for this effect a transistor T13 capacitively couples clock signal ZP2, which is complementary to clock signal ZP1, to the gate of transistor T9. Specifically, transistor T13 has a gate coupled to receive clock signal ZP2 and a drain and source coupled to the gate of transistor T9. Since both the drain and source capacitances of transistor T13 are used, transistor T13 is made to be one-half the size of transistor T12 so that transistors T12 and T13 have equal capacitances.

It is desirable to delay the ZP1 clock signal relative to the P1 clock signal in order to provide stable sensing of the logic level output signal on output line Q1 at the end of the P2 clock signal prior to the closing of the feedback loop associated with the ZP1 clock signal being applied to transistor T12. Further, it is desirable to have clock signal ZP1 characterized by a low dV/dt to reduce the capacitive coupling. Finally, it is desirable to overlap the transitions of clock signals ZP1 and ZP2 to stabilize voltage V1. Therefore, clock circuitry 50 provides complementary clock signals ZP1 and ZP2, delayed with respect to clock signals P1 and P2 as shown in FIG. 3. Clock circuit 50 comprises transistors T14–T17 coupled as complementary push-pull pairs responsive to clock signals P1 and P2 and provides complementary logic level signals ZP1 and ZP2.

Inverting amplifier 40 of sense amplifier 30 is characterized by a threshold voltage $V_{th}$. In the preferred embodiment, the threshold voltage is typically between 0.7 and 2.0 volts. When the voltage on data line D1 exceeds the threshold voltage $V_{th}$, the voltage on output line Q1 is substantially equal to the ground voltage. When the voltage on the data line D1 is less than the threshold voltage $V_{th}$ of inverting amplifier 40, the voltage on output line Q1 is substantially equal to the supply voltage VCC. The transfer characteristic of inverting amplifier 40 is illustrated in FIG. 4.

In operation, during the first phase the current i provided by the current supply transistor T9 is responsive to the output signal on output line Q1 such that the current i which flows through transistor T1 of reference circuit 20 is adjusted to provide a precharge voltage on the data line D1 which is substantially equal to the threshold voltage of the inverting amplifier 40. This current is held during the subsequent phase 2. The presence or nonpresence of an active array transistor on the data line during phase 2 determines whether a rise or fall in the voltage on data line D1 occurs. Since the voltage on data line D1 has already been precharged to the threshold voltage $V_{th}$ of inverting amplifier 40, only a small voltage change on data line D1 is required in order for the sense amplifier to respond to the presence or nonpresence of the array transistor on the data line.

In the preferred embodiment of the present invention, the circuitry of FIG. 1 has been integrated in an NMOS circuit using the device sizes and types shown in Table 1. Widths and lengths (W and L) are given in microns, and the device types are abbreviated as HE for hard enhancement, SE for soft enhancement and HD for hard depletion. In the preferred embodiment, a soft enhancement device has an intrinsic threshold voltage in the range of −0.34 to 0.89 volts, a hard depletion device has an intrinsic threshold voltage in the range of −2.85 to −1.28 volts, and a hard enhancement device has an intrinsic threshold voltage in the range of 0.26 to 1.6 volts.

TABLE 1

| Device | W/L (Microns) | Type |
|---|---|---|
| T1–3 | 3.5/7 | HE |
| T4–8 | 3.5/3.5 | HE |
| T9 | 50/6 | SE |
| T10 | 60/3.5 | HE |
| T11 | 8/6 | HD |
| T12 | 12/4 | HE |
| T13 | 6/4 | HE |
| T14–T15 | 30/5 | SE |
| T16–T17 | 30/3.5 | HE |
| T20–T23 | 60/6 | HE |

I claim:
1. An integrated memory circuit for providing a logic level output signal representative of a bit of data comprising:
source means for providing first and second voltages;
clock means for providing alternating first and second clock signals;
a conductive data line associated with the bit of data;
memory cell means coupled to the data line, the source means and the clock means for selectively providing a current path between the data line and the first voltage in response to the value of the bit and the second clock signal;
reference means coupled to the data line, the source means and the clock means for providing a current path between the data line and the first voltage in response to the first clock signal, the resistance of the current path provided by the reference means being greater than the resistance of the current path selectively provided by the memory cell means;
amplifier means coupled to the data line and to the source means and characterized by a threshold voltage for providing a logic level output signal representative of the value of the bit in response to the voltage on the data line relative to the threshold voltage; and
current source means coupled to the amplifier means, to the clock means, to the source means and to the data line for providing current to the data line, the amplitude of the current being adjusted in response to the output signal and the first clock signal such that the voltage of the data line is adjusted to be substantially equal to the threshold voltage during the first clock signal and the amplitude of the current is maintained during a subsequent second clock signal.

2. An integrated memory circuit for providing output signals representative of the bits of a data word selected from a plurality of stored data words comprising:
source means for providing first and second voltages;
clock means for providing alternating first and second clock signals;
a plurality of conductive address lines, each address line associated with one of the stored data words;
a plurality of conductive data lines, each data line associated with a bit position;
word select means coupled to the clock means and responsive to the second clock signal for applying an address signal to the address line associated with the selected data word;
memory cell means coupled to the address lines, to the data lines and to the source means for selectively providing a current path between a data line and the first voltage in response to a signal on an address line and the value of the bit of the selected data word associated with the data line;

reference means coupled to the data lines, to the source means and to the clock means for providing a current path between each of the data lines and the first voltage in response to the first clock signal, the resistance of the current paths provided by the reference means being greater than the resistance of the current paths selectively provided by the memory cell means;

a plurality of amplifier means, each data line having an amplifier means coupled to it, each amplifier means coupled to the source means and characterized by a threshold voltage, each for providing a logic level output signal representative of the bit of the selected data word associated with a data line in response to the voltage on the data line relative to the threshold voltage; and a plurality of current source means, one coupled to each amplifier means, each current source means coupled to the clock means, the source means and the data line coupled to that amplifier means for providing current to that data line, the value of the current being adjusted in response to that output signal of the amplifier means and the first clock signal such that the voltage of the data line is adjusted to be substantially equal to the threshold voltage of the coupled amplifier means during the first clock signal and the value of the current of the current source means is maintained during the second clock signal.

3. An integrated memory circuit as in claim 2 further comprising resistive means for providing a damping resistance between the data lines and the associated amplifier means.

4. An integrated memory circuit as in claim 3 wherein the resistive means comprises select transistors, the select transistors coupling one of a number of data lines to an amplifier means.

5. An integrated memory circuit as in claim 2 wherein the resistance of the current paths provided by the reference means is substantially equal to twice the resistance of the current paths selectively provided by the memory cell means.

6. An integrated memory circuit as in claim 2 or 5 wherein the memory cell means comprises a plurality of transistors, each transistor having a gate coupled to one of the address lines, a drain coupled to one of the data lines and a source coupled to the first voltage.

7. An integrated memory circuit as in claim 6 wherein the reference means comprises a plurality of transistors, each transistor having a gate coupled to receive the first clock signal, a drain coupled to one of the data lines, and a source coupled to the first voltage.

8. An integrated memory circuit as in claim 2 wherein each amplifier means comprises;
    a depletion transistor having a drain coupled to the second voltage and a gate coupled to its source; and
    an enhancement transistor having a drain coupled to the source of the depletion transistor, a gate coupled to the data line and a source coupled to the first voltage.

9. An integrated memory circuit as in claim 1 or 8 wherein each current source means comprises:
    a first transistor having a gate coupled to receive the first clock signal, a drain coupled to receive the output signal of the amplifier means coupled thereto, and a source; and
    a second transistor having a drain coupled to the second voltage, a gate coupled to the source of the first transistor and a source coupled to the data line.

10. An integrated memory circuit as in claim 9 wherein each current source means further comprises a third transistor having a gate coupled to receive the second clock signal, and its drain and source coupled to the gate of the second transistor, the third transistor being approximately one-half the size of the first transistor.

11. An integrated memory circuit as in claim 10 further comprising additional clock means coupled between the clock means and the current source means for providing complementary clock signals to the first and third transistors.

12. An integrated memory circuit as in claim 11 wherein the additional clock means delays and decreases the maximum slope of the clock signals applied to the current source means with respect to the first and second clock signals.

13. A method for providing a logic level output signal representative of a bit of a selected data word in an integrated addressable memory circuit comprising the steps of:
    providing the logic level output signal having a first or second amplitude in response to the voltage on a data line being less than or greater than a threshold voltage respectively;
    adjusting the voltage of the data line during a first phase in response to the output signal to substantially equal the threshold voltage; and
    increasing or decreasing the voltage of the data line in response to the value of a bit of a selected data word during a second phase, the first and second phases alternating in time.

14. A method as in claim 13 wherein the step of providing the output signal comprises the step of amplifying the voltage on the data line and the step of adjusting the voltage of the data line is performed in response to the amplified voltage.

15. A method as in claim 14 wherein the step of adjusting the voltage of the data line is performed by adjusting a current applied to the data line during the first phase and this current is maintained during the subsequent second phase.

16. A method as in claim 15 wherein the step of increasing or decreasing the voltage of the data line is performed by varying the resistance of the current path through the data line.

* * * * *